(12) United States Patent
Conley

(10) Patent No.: US 10,754,142 B2
(45) Date of Patent: Aug. 25, 2020

(54) ELECTRONIC UP-CONVERSIONS OF A SCENE USING A PIXELATED DETECTOR ARRAY

(71) Applicant: The United States of America, as represented by the Secretary of the Navy, Crane, IN (US)

(72) Inventor: Benjamin R. Conley, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 41 days.

(21) Appl. No.: 16/002,000

(22) Filed: Jun. 7, 2018

(65) Prior Publication Data
US 2018/0356625 A1 Dec. 13, 2018

Related U.S. Application Data

(60) Provisional application No. 62/603,623, filed on Jun. 7, 2017.

(51) Int. Cl.
| | | |
|---|---|---|
| *G02B 23/12* | (2006.01) | |
| *G02B 13/16* | (2006.01) | |
| *H01L 31/103* | (2006.01) | |
| *H03F 3/08* | (2006.01) | |
| *H04N 5/33* | (2006.01) | |
| *H03F 3/45* | (2006.01) | |

(52) U.S. Cl.
CPC ............ *G02B 23/12* (2013.01); *G02B 13/16* (2013.01); *H01L 31/1035* (2013.01); *H03F 3/087* (2013.01); *H03F 3/45475* (2013.01); *H04N 5/33* (2013.01); *H03F 2203/45528* (2013.01)

(58) Field of Classification Search
CPC ........ G02B 23/12; G02B 13/16; G02B 27/01; H03F 3/45475; H03F 3/087; H03F 2203/45528; H01L 31/1035; H01L 33/0004; H04N 5/33
See application file for complete search history.

(56) References Cited

U.S. PATENT DOCUMENTS

| | | | | |
|---|---|---|---|---|
| 4,275,302 | A | | 6/1981 | Imbert et al. |
| 5,332,899 | A | * | 7/1994 | Wolny ................ H01L 27/1465 250/332 |
| 5,438,198 | A | | 8/1995 | Ebitani et al. |
| 5,519,529 | A | * | 5/1996 | Ahearn .................. B82Y 20/00 359/248 |
| 5,710,428 | A | * | 1/1998 | Ko .......................... G02B 23/12 250/332 |

(Continued)

*Primary Examiner* — Que Tan Le
*Assistant Examiner* — Jennifer D Bennett
(74) *Attorney, Agent, or Firm* — Naval Surface Warfare Center, Crane Division; Christopher A. Monsey

(57) ABSTRACT

Systems are provided including night vision goggles and up-conversion circuits for converting short wave infrared (SWIR) light into near infrared (NIR) light or other visible light in low-light environments. An array of electrically coupled photodiodes, amplifiers, and NIR light emitters generate and amplify a current in response to SWIR, powering the light emitters to generate NIR light. The NIR can then be directed into a photomultiplier tube to amplify the light and allow an operator to see in low-light environments.

5 Claims, 4 Drawing Sheets

(56) References Cited

U.S. PATENT DOCUMENTS

| | | | | |
|---|---|---|---|---|
| 7,345,277 B2* | 3/2008 | Zhang | ............ | G02B 23/125 |
| | | | | 250/330 |
| 2008/0179520 A1* | 7/2008 | Kauffman | ............ | G02B 23/12 |
| | | | | 250/332 |
| 2017/0234976 A1* | 8/2017 | Grauer | ............ | G01S 17/107 |
| | | | | 356/5.04 |

* cited by examiner

ELECTRONIC UP-CONVERSIONS OF A SCENE USING A PIXELATED DETECTOR ARRAY

CROSS-REFERENCE TO RELATED APPLICATIONS

The present application claims priority to U.S. Provisional Patent Application Ser. No. 62/603,623, filed Jun. 7, 2017, entitled "ELECTRONIC UP-CONVERSIONS OF A SCENE USING A PIXELATED DETECTOR ARRAY," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,440) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The present invention relates to a system for viewing infrared light by up-converting with a pixelated detector array.

Background and Summary of the Invention

The present invention relates to an up-conversion system for allowing infrared (IR) light, including short wave infrared (SWIR) light), to be viewed by a night vision goggle (NVG) system. Typical NVG systems detect and amplify visible light, including near infrared (NIR) light, with a photomultiplier/image intensifier tube to allow an operator to see in low light environments. Under typical nighttime conditions, both SWIR and NIR ambient light are present, with SWIR light exceeding NIR light by more than an order of magnitude. There is a need for an efficient and low cost means of allowing SWIR light to be viewed in a visible spectrum by NVG systems without requiring a large amount of power.

According to an illustrative embodiment of the present disclosure, SWIR diodes can generate current when receiving SWIR light. This current can be amplified by transimpedance amplifiers to allow LEDs to emit NIR light with minimal power input.

According to a further illustrative embodiment of the present disclosure, an up-conversion system can be placed in a NVG system between an objective lens and a photomultiplier tube. The up-conversion system converts SWIR to NIR light, allowing the photomultiplier tube to amplify the converted NIR light.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
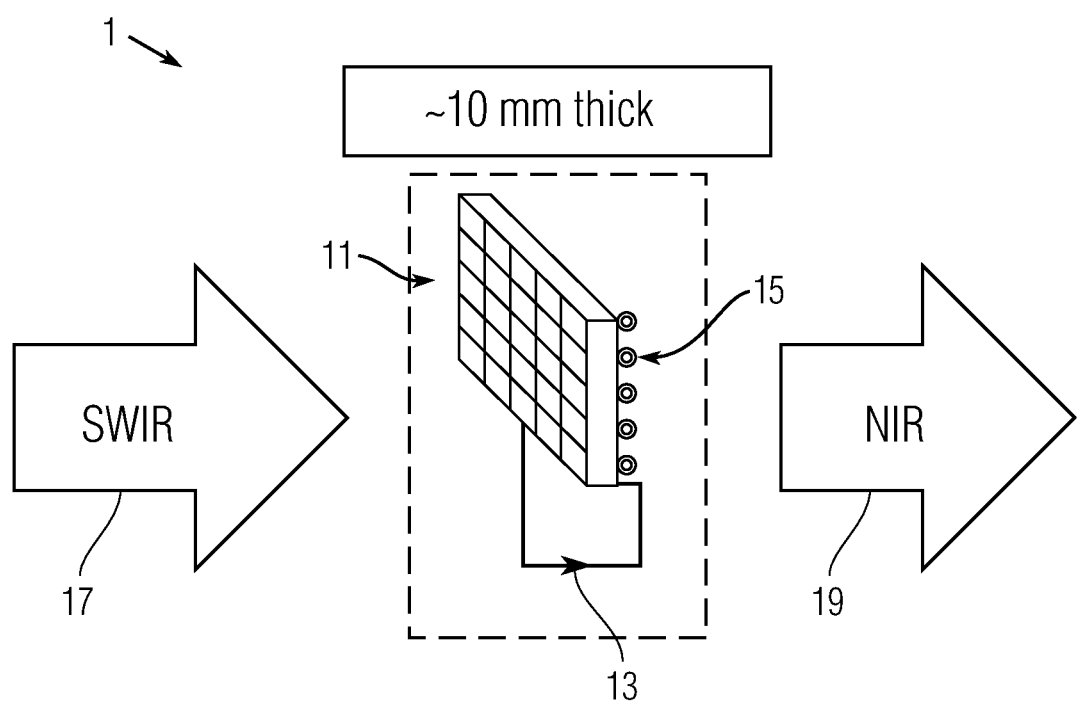
FIG. 1 shows an exemplary system for converting SWIR to NIR light.

FIG. 1 shows an exemplary up-conversion system 1. Up-conversion system 1 can use a bump or flip chip bonded setup comprising a plurality of SWIR photodiodes 11, a plurality of transimpedance amplifiers 13, and a plurality of NIR emitters 15. SWIR photodiodes 11 absorb incoming SWIR light to generate an electrical current. The electrical current is amplified by amplifier 13 to allow NIR emitters (e.g., red LEDs) to emit visible light.

Figure 2:
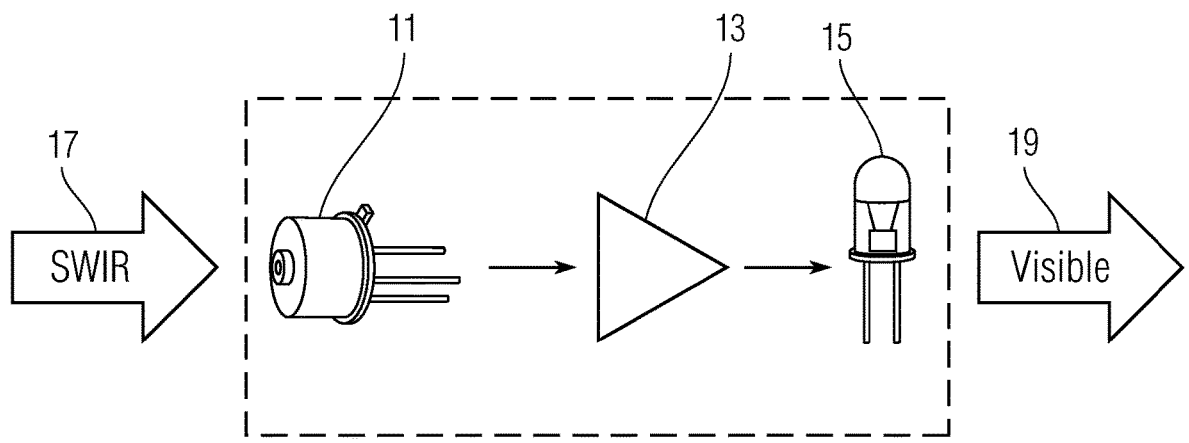
FIG. 2 shows an exemplary single cell for converting SWIT to NIR light.

FIG. 2 shows an exemplary up-conversion system 1 with a single exemplary SWIR photodiode 11, amplifier 13, and NIR emitter 15. For ideal performance, photodiode 11 should have a high absorption coefficient in the spectral band of interest (e.g., infrared), epitaxy growth compatibility with a low cost and scalable substrate, and a material system compatible with donor and acceptor dopants to form p-n junctions. Examples of photodiode 11 include InGaAs, HgCdTe, SiGe superlattices, and GeSn. The final light emission after detection and amplification can be through an array of light emitting diodes (LEDs) that have direct one-to-one signal transfer such that each incident of SWIR light detection creates a single NIR light signal.

Figure 3:
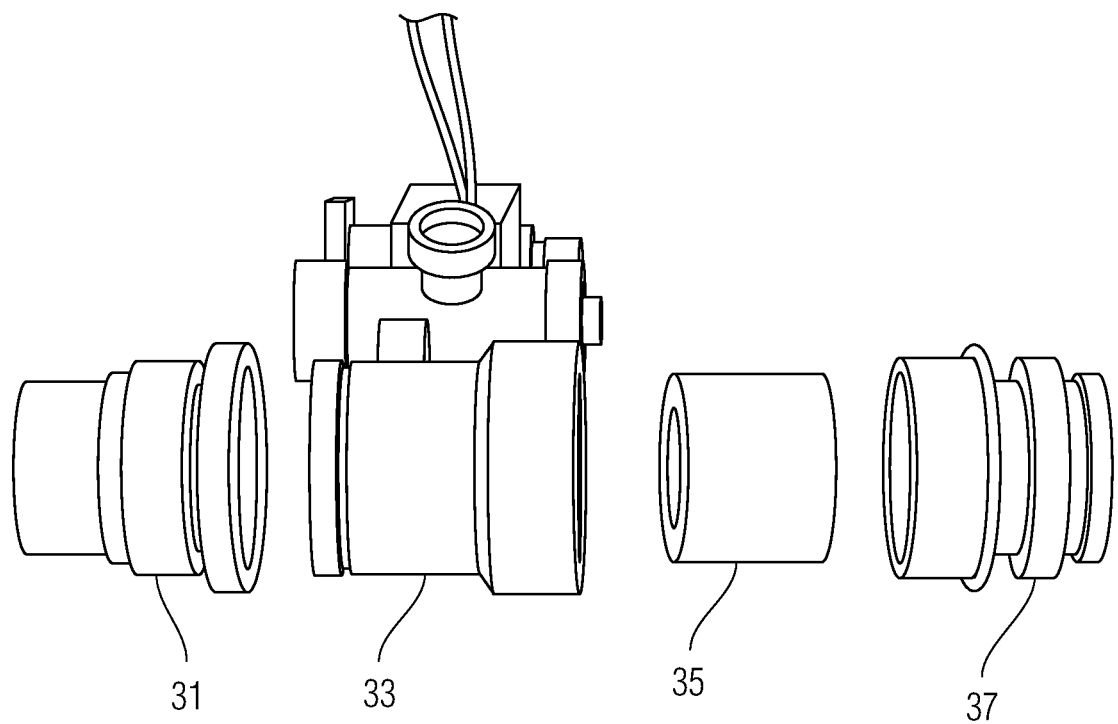
FIG. 3 shows exemplary components of a NVG system.

FIG. 3 shows an exemplary NVG system broken down into its core components. An objective lens 31 is directed towards a target of interest. A housing assembly 33 covers an image intensifier tube 35 and connects to the objective lens 31 and an eyepiece 37. An exemplary up-conversion system (not shown) can be placed within housing assembly 33 between objective lens 31 and image intensifier tube 35 such that incoming SWIR light can first enter the objective lens 31 and then reach up-conversion system. NIR light emitted by the up-conversion system can then reach the image intensifier tube 35 to amplify the light and allow an operator to view the light through the eyepiece 37. Exemplary up-conversion systems can be about 10 mm thick, allowing for insertion into existing NVG systems with zero or minimal modifications to the housing.

Figure 4:
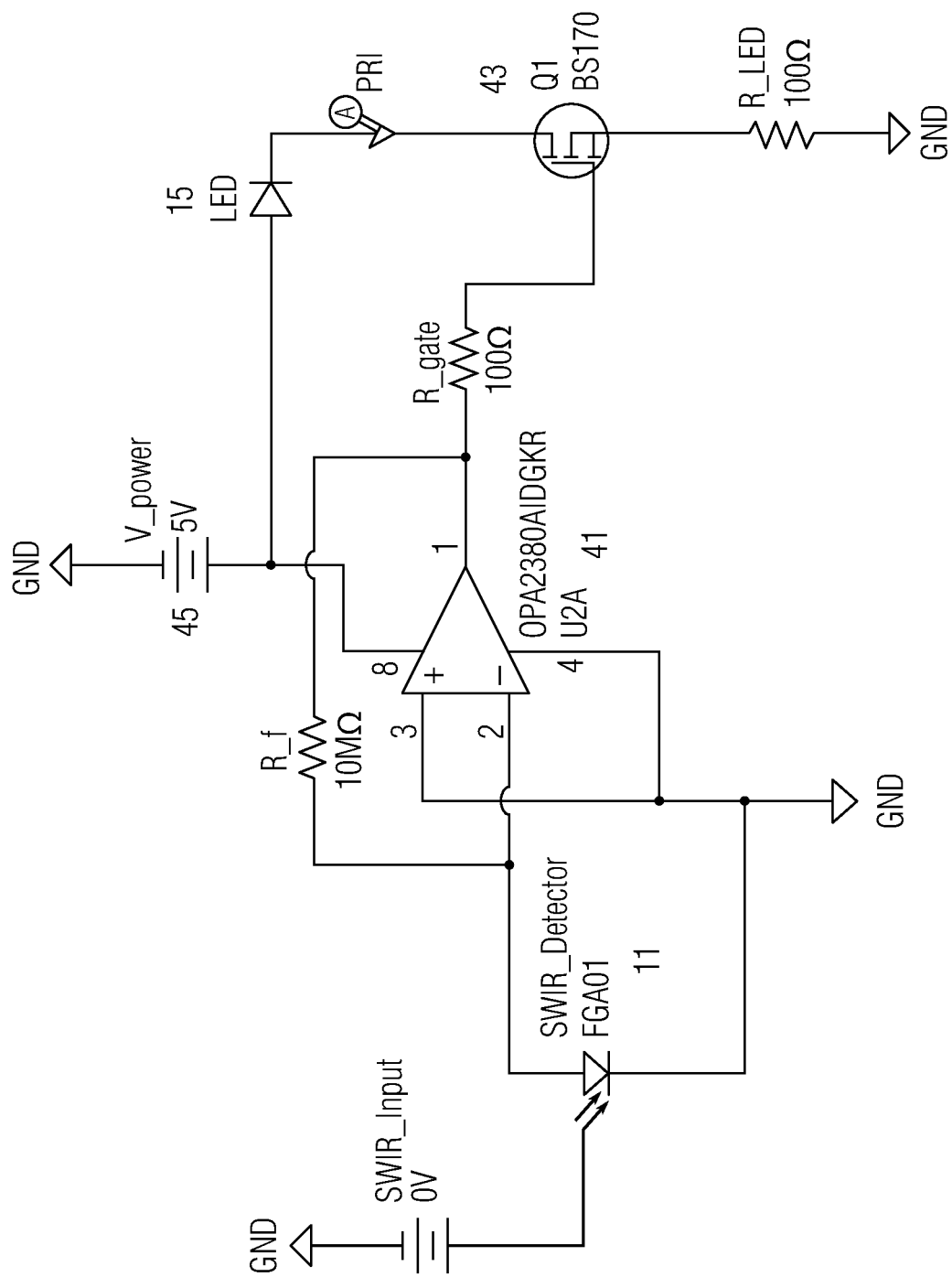
FIG. 4 shows an exemplary circuit layout for an up-conversion system.

FIG. 4 shows an exemplary circuit of an up-conversion system (e.g., as shown in FIG. 2). Photodiode 11 creates a current upon receiving SWIR light. Transimpedance amplifier 41 amplifies the current created by photodiode 11. NIR emitter 15 (e.g., an LED) generates NIR light. Transistor Q1 43 is an n-channel MOSFET, and a power source 45 of 5V is provided. A 2,000 pixels by 2,000 pixels (4 million total pixels) array of exemplary circuits can operate with a power draw of about 485 mW across all of the amplifiers and about 97 mW across all of the NIR emitters.

Although the invention has been described in detail with reference to certain preferred embodiments, variations and modifications exist within the spirit and scope of the invention as described and defined in the following claims.

The invention claimed is:

1. A night vision goggle (NVG) system comprising:
   a housing assembly;
   at least one objective lens;
   at least one photomultiplier tube;
   at least one eyepiece; and
   at least one short wave infrared (SWIR) light up-conversion system comprising:
   a plurality of SWIR photodiodes configured to convert SWIR light into an electrical current;
   a plurality of amplifiers;
   a plurality of near infrared (NIR) light emitters configured to emit NIR light when activated by a current;
   wherein the plurality of SWIR photodiodes, the plurality of amplifiers, and the plurality of NIR light emitters are electrically coupled such when the SWIR photodiodes receive SWIR light, the SWIR photodiodes create an electrical current which is amplified by the amplifiers to activate the NIR light emitters
   wherein the housing assembly is configured to couple with the at least one objective lens on a first side of the housing assembly and the at least one eyepiece on a second side of the housing assembly;
   wherein the housing assembly is configured to hold the at least one photomultiplier tube and the at least one up-conversion system within the housing assembly, wherein each up-conversion system is between a corresponding objective lens of the at least one objective lens and a corresponding photomultiplier tube of the at least one photomultiplier tube, wherein each wherein each up-conversion system is between a corresponding objective lens of the at least one objective lens and a corresponding photomultiplier tube of the at least one photomultiplier tube is between a corresponding up-conversion system of the at least one up-conversion system and a corresponding eyepiece of the at least one eyepiece;
   wherein SWIR entering the at least one objective lens is directed towards the corresponding up-conversion system, wherein light leaving the up-conversion system is directed towards the photomultiplier tube, wherein light leaving the photomultiplier tube is directed towards the eyepiece.

2. The NVG system of claim 1, wherein each amplifier of the plurality of amplifiers is a transimpedance amplifier.

3. The NVG system of claim 1 further comprising a power source.

4. The NVG system of claim 1, wherein each NIR light emitter of the plurality of NIR light emitters is a light emitting diode (LED).

5. The NVG system of claim 1, wherein each SWIR photodiode of the plurality of SWIR photodiodes is an indium gallium arsenide photodiode.

* * * * *